(12) United States Patent
Prabhakaran et al.

(10) Patent No.: US 7,043,386 B2
(45) Date of Patent: May 9, 2006

(54) POTENTIOMETER PROVIDING A HIGH RESOLUTION

(75) Inventors: Joy P Prabhakaran, Bangalore (IN); Jayaram B Srinivasmurthy, Bangalore (IN)

(73) Assignee: Honeywell International Inc, Morristown, NJ (US)

( * ) Notice: Subject to any disclaimer, the term of this patent is extended or adjusted under 35 U.S.C. 154(b) by 0 days.

(21) Appl. No.: 10/708,800

(22) Filed: Mar. 26, 2004

(65) Prior Publication Data

US 2005/0212537 A1 Sep. 29, 2005

(51) Int. Cl.
*G06F 19/00* (2006.01)

(52) U.S. Cl. .................. 702/107; 338/13; 324/723; 324/714; 341/145; 341/153

(58) Field of Classification Search ............... 702/107; 323/353, 354; 341/144, 145, 153; 338/13; 330/102; 324/723, 714
See application file for complete search history.

(56) References Cited

U.S. PATENT DOCUMENTS

| | | | | |
|---|---|---|---|---|
| 5,243,535 A | * | 9/1993 | Bolan et al. ................... 702/65 |
| 5,355,083 A | * | 10/1994 | George et al. ............... 324/229 |
| 5,541,510 A | * | 7/1996 | Danielson ................... 324/233 |
| 6,201,491 B1 | * | 3/2001 | Brunolli et al. ............ 341/154 |
| 6,225,929 B1 | * | 5/2001 | Beck .......................... 341/144 |
| 6,331,768 B1 | * | 12/2001 | Drori et al. ................. 323/369 |
| 6,384,762 B1 | * | 5/2002 | Brunolli et al. ............ 341/144 |
| 6,414,616 B1 | * | 7/2002 | Dempsey ..................... 341/144 |
| 6,555,996 B1 | * | 4/2003 | Drori et al. ................. 323/369 |
| 6,771,053 B1 | * | 8/2004 | Stanescu et al. ............ 323/298 |
| 6,809,531 B1 | * | 10/2004 | Slye et al. .................. 324/714 |
| 6,885,328 B1 | * | 4/2005 | Kao et al. ................... 341/144 |
| 2001/0038351 A1 | * | 11/2001 | Brunolli et al. ............ 341/154 |
| 2003/0155902 A1 | * | 8/2003 | Stanescu et al. ............ 323/354 |
| 2004/0108844 A1 | * | 6/2004 | Stanescu et al. ............ 323/298 |
| 2004/0252750 A1 | * | 12/2004 | Gruszecki et al. .......... 374/185 |
| 2005/0024099 A1 | * | 2/2005 | Ross et al. .................. 327/103 |
| 2005/0052305 A1 | * | 3/2005 | Voicu et al. ................. 341/154 |
| 2005/0052306 A1 | * | 3/2005 | Voicu et al. ................. 341/154 |

OTHER PUBLICATIONS

Alan Li, "AN-582 Resolution Enhancements of Digital Potentiometers with Multiple Devices", Rev A Dec. 19, 2001.*
Dallas Semiconductor Application Note 140, "Using Multiple DS 1267 Digital Potentiometers with an 8051 Microprocessor Generating 3-Wire Signals", data unknown.*
Analog Devices, "Frequently Asked Questions: Digital Potentiometers", webpage: www.analog.com, date unknown.*
Xicor, Application Note AN124, "A Primer on Digitally-Controlled Potentiometers", Feb. 2000.*

* cited by examiner

*Primary Examiner*—Patrick J. Assouad
(74) *Attorney, Agent, or Firm*—Narendra R Thappeta

(57) ABSTRACT

A high resolution potentiometer implemented using at least two digital potentiometers connected in parallel. Each digital potentiometer is controlled to provide a corresponding resistance value, and a desired resistance value is attained by such control. The resolution is high in some range of desired resistance values and low in other ranges. A high resolution in a desired range can be attained by connecting another resistor in series with the digital potentiometers connected in parallel.

11 Claims, 5 Drawing Sheets

POTENTIOMETER PROVIDING A HIGH RESOLUTION

BACKGROUND OF INVENTION

1. Field of the Invention

The present invention generally relates to measurements systems, and more specifically to a potentiometer providing high resolution.

2. Related Art

Potentiometer generally refers to a device/component which provides variable resistance. In a typical scenario, a user specifies a desired resistance, and the potentiometer provides the specified resistance. Examples of situations in which potentiometers are used include radio tuning, television brightness control, regulator of a fan, etc.

Potentiometers are often characterized by resolution. Resolution refers to the minimal change in resistance that can be offered by (or attained by using) a potentiometer. For example, a resolution of 0.1 ohm implies that a change of 0.1 Ohm can be reliably attained from a previous resistance value. In other words, it may not be possible to reliably attain a resistance change of less than 0.1 Ohm. It is often desirable that potentiometers provide high resolution, i.e., ability to change resistance by a small value.

An analog potentiometer is often employed to provide such high resolution. A typical analog potentiometer contains a resistor which can be tapped at different points to attain a corresponding resistance. As the tap points can potentially be contiguous (or with extremely small distance in between), a correspondingly high resolution can be attained.

However, one problem with analog potentiometers is that tapping at different points generally requires use of mechanical components. Non-manual approaches to attaining precise movement (and thus the desired precise resolution) often presents technical challenges, thereby making it generally undesirable for use in electronic/electrical systems, as is well known in the relevant arts.

Digital potentiometers overcome some of such disadvantages. Digital potentiometers often contain digital switching elements (e.g., transistors) which are operated to connect only some of the available resistors to provide a desired resistance value. As an illustration, one prior digital potentiometer contains discrete resistors providing equal resistance connected in series, and a digital circuit includes a number of resistors corresponding to a specified resistance between output terminals. For example, a digital potentiometer may contain 10 resistors each providing 100 ohms resistance, and 4 of the resistors may be connected between output terminal assuming that the specified resistance equals 400 ohms.

Digital potentiometers are suitable for integration into electrical/electronic environments since the switching elements can be implemented at least substantially using only electronic/electrical technologies. However, one problem with digital potentiometers is that the available resolution is often low (compared to analog potentiometers). In the illustrative example of above, the digital potentiometer provides a resolution of 100 ohms. At least in some environments it may be desirable to provide potentiometers which provide the advantages of digital potentiometers, and yet offer higher resolutions.

SUMMARY OF INVENTION

An aspect of the present invention provides a high resolution potentiometer by connecting multiple digital potentiometers connected in parallel. In an embodiment, the digital potentiometers are operable to provide different resistance values, which generally leads to a high resolution.

A control block may determine the resistance values (to which each of the digital potentiometers is to be set) for attaining a desired effective resistance, and configures the digital potentiometers accordingly. In an embodiment, the resistance values are determined such that the effective resistance provided by said high resolution potentiometer at least substantially equals the desired effective resistance.

Due to the approach(es) of above, different resolution may be obtained in different effective resistance value ranges. To obtain a desired resolution in a desired effective resistance values range, a resistor may be connected in series with the digital potentiometers connected in parallel. The digital potentiometers and the resistor may be implemented in the form of a single integrated circuit.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF DRAWINGS

The present invention will be described with reference to the accompanying drawings which are described briefly below.

DETAILED DESCRIPTION

1. Overview

An aspect of the present invention provides a potentiometer ("high resolution potentiometer") with a high resolution by connecting multiple digital potentiometers in parallel. Due to the use of potentiometers in parallel, a high resolution is attained. By using digital potentiometers, the high resolution potentiometer can be implemented in the form of an integrated circuit, as well as potentially be easily integrated into electrical/electronic systems.

According to another aspect of the present invention, each of the digital potentiometers is controlled independently such that the resistance value offered by the individual digital potentiometers is potentially unequal. Due to the parallel connection and the independent control, the high resolution potentiometer provides a non-uniform resolution in different ranges of effective resistance values.

In one embodiment, a resistor is provided in series with the parallel combination of digital potentiometers to ensure that a desired (high) resolution is in the range of desired effective resistance values attained by the high resolution potentiometer. Such a feature may be appreciated by understanding that the resolution is small in some ranges and large in other ranges. Thus, higher resolution may be attained in the desired range of effective resistance values.

One more aspect of the present invention provides an approach to provide an effective resistance as close as possible to a desired resistance by taking into consideration the fact that substantially equal effective resistance can be attained by multiple combinations of individual resistances of the two digital potentiometers.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example System

Figure 1:
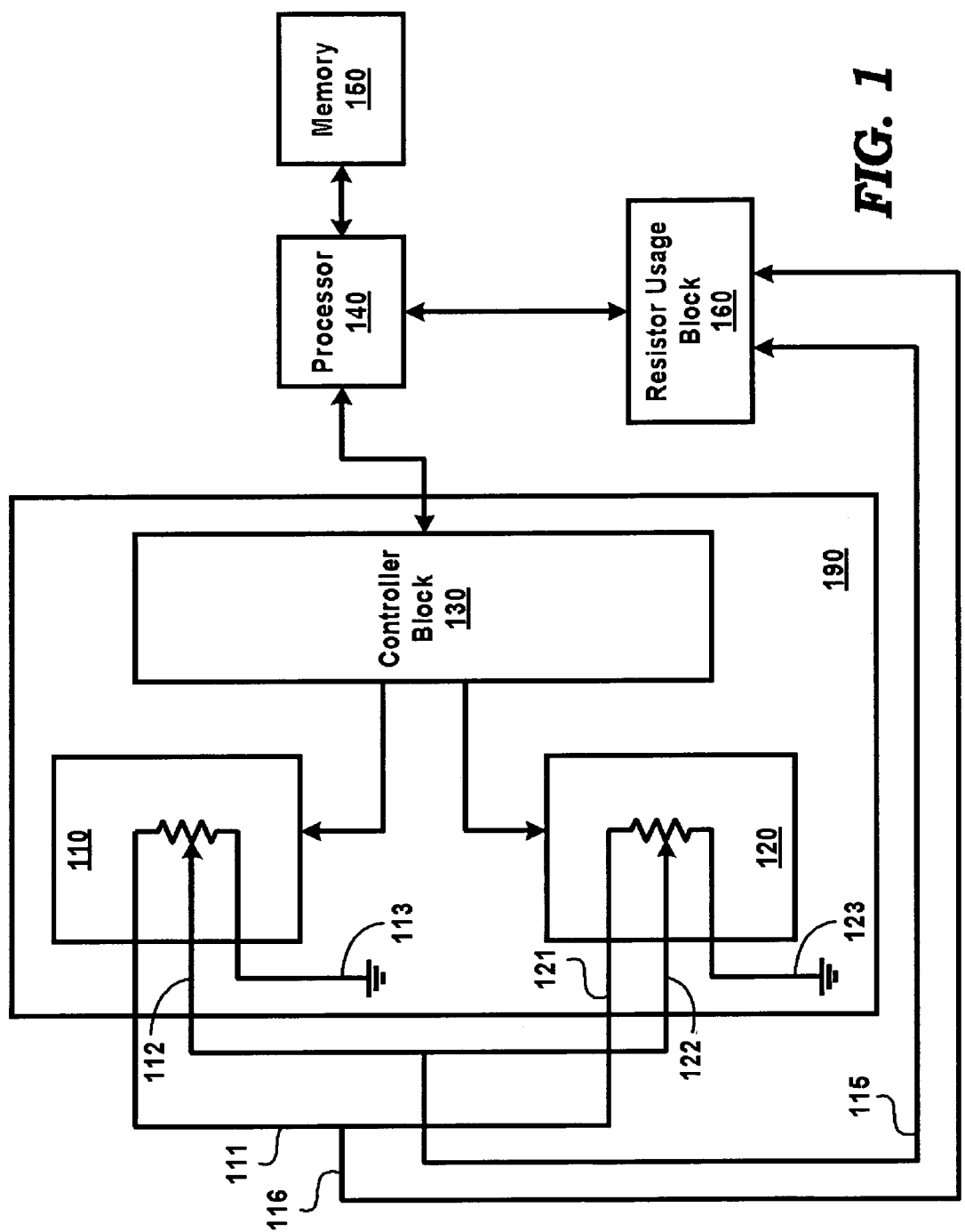
FIG. 1 is a block diagram illustrating an example system in which various aspects of the present invention can be implemented.

FIG. 1 is a block diagram illustrating the details of an example system implemented according to an aspect of the present invention. System 100 is shown containing digital potentiometers 110 and 120, controller block 130, processor 140, memory 150, and resistor usage block 160. Each component is described below in further detail.

Digital potentiometers 110 and 120 are shown connected in parallel by connecting terminals 111 and 112 of digital potentiometer 110 to terminals 121 and 122 of digital potentiometer 120 respectively. The two digital potentiometers along with controller block 130 operate to provide high resolution potentiometer 190 as described below in further detail. Each digital potentiometer may contain resistor portions (referred to as "resistor network") connected in series as illustrated in further detail with reference to FIG. 2.

Figure 2:
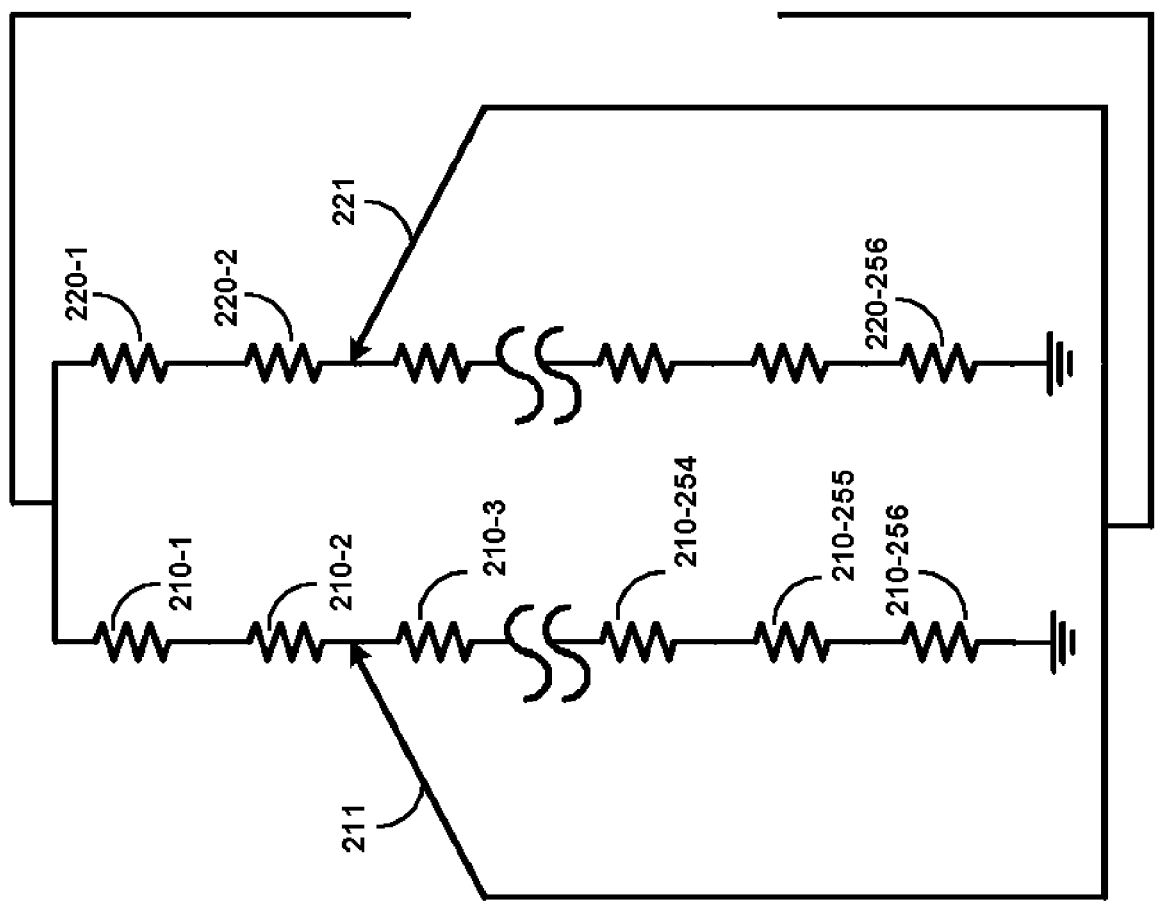
FIG. 2 is a circuit diagram illustrating logically the effective resistance offered by two digital potentiometers connected in parallel, according to an aspect of the present invention.

FIG. 2 thus depicts resistor portions 210-1 through 210-256 (forming the resistor network for digital potentiometer 110) and resistor portions 220-1 through 220-256 (forming the resistor network for digital potentiometer 120). The two resistor networks are connected in parallel, consistent with the representation of FIG. 1.

The resistance value offered by each digital potentiometer depends on the corresponding tap point (or terminal, as will be clear from the context) 211/221. For example, assuming that each resistor portion offers a uniform resistance of 1 unit, to provide a resistance value of 2 units (by digital potentiometer 110), tap terminal 211 may be connected at the junction of resistor portions 210-2 and 210-3. The manner in which digital potentiometer 120 can be configured to provide a desired step of resistance is also described similarly.

Continuing with exclusive reference to FIG. 1, digital potentiometers 110 and 120 are respectively shown containing logical taps 112 and 122, which respectively determine the individual resistance offered by the corresponding digital potentiometer. It should be understood that the Figures merely provide logical representation of digital potentiometers, and each potentiometer can be implemented using one of several products commercially available in the market place.

Controller block 130 controls the resistance value provided by each digital potentiometer 110/120 by controlling logical taps 112/122. In one embodiment, controller block 130 receives a desired resistance and controls the logical taps to provide the desired resistance. In an alternative embodiment, controller block 130 receives the resistance value each digital potentiometer is to be configured to, and the corresponding tap point(s) is controlled accordingly.

According to an aspect of the present invention, controller block 130 controls the two digital potentiometers independently such that different resistance values are provided by the two potentiometers at any instance of time. Due to such independent control, non-uniform resolution is offered at different effective resistance values, as described below in further detail. The interface between controller block 130 and the digital potentiometers generally depends on the implementation details of the digital potentiometers, and the implementation of such interface will be apparent to one skilled in the relevant arts.

Processor 140 may retrieve various instructions from memory 150 (e.g., ROM, RAM) to provide various user applications (e.g., brightness control of a television, power control in a microwave, simulated resistance of any resistive sensor, any voltage divider) by appropriate interface with high resolution potentiometer 190 and resistor usage block 160. Processor 140 may determine the present effective resistance desired based on various inputs (e.g., position of a knob determining fan speed), and interfaces with high resolution potentiometer 190 to provide a desired resolution.

Resistor usage block 160 uses the effective resistance provided by high resolution potentiometer 190. Assuming that digital potentiometers 110 and 120 are respectively configured to provide resistances R1 and R2, the effective resistance R is given by the following equation:

$$R = (R1 \times R2)/(R1+R2) \qquad \text{Equation (1)}$$

Due to the independent control of the digital potentiometers, non-uniform resolution may be attained as described below in further detail.

3. Non-Uniform Resolution

The effective resistance R for combination of some representative resistance values are shown in Appendix. All the combinations are not shown there in the interest of conciseness. The values there are provided assuming that each digital potentiometer contains 256 resistor portions (as shown in FIG. 2), with each resistor portion having a resistance of 4 Ohms (i.e., 1 Unit=4 Ohms). It should be further appreciated that the unit volume in different potentiometers can be different, though both potentiometers are described as being identical merely for convenience.

The appendix is shown containing four columns, R1 (resistance to which digital potentiometer 110 is set/programmed), R2 (resistance to which digital potentiometer 120 is programmed), R (effective resistance offered), and resolution value. For simplicity, resolution value here is computed as a difference of effective resistance R for the present row less the corresponding value for the previous row. For example, the resolution value for the combination of R1=4 and R2=36 is shown as 0.04444, which equals (3.6 3.55556).

It may thus be appreciated that a non-uniform resolution (value) is presented at different effective resistance values. It may be further observed that the resolution (value) is lower in some ranges and higher in other ranges as may be observed from FIG. 3 below.

Figure 3:
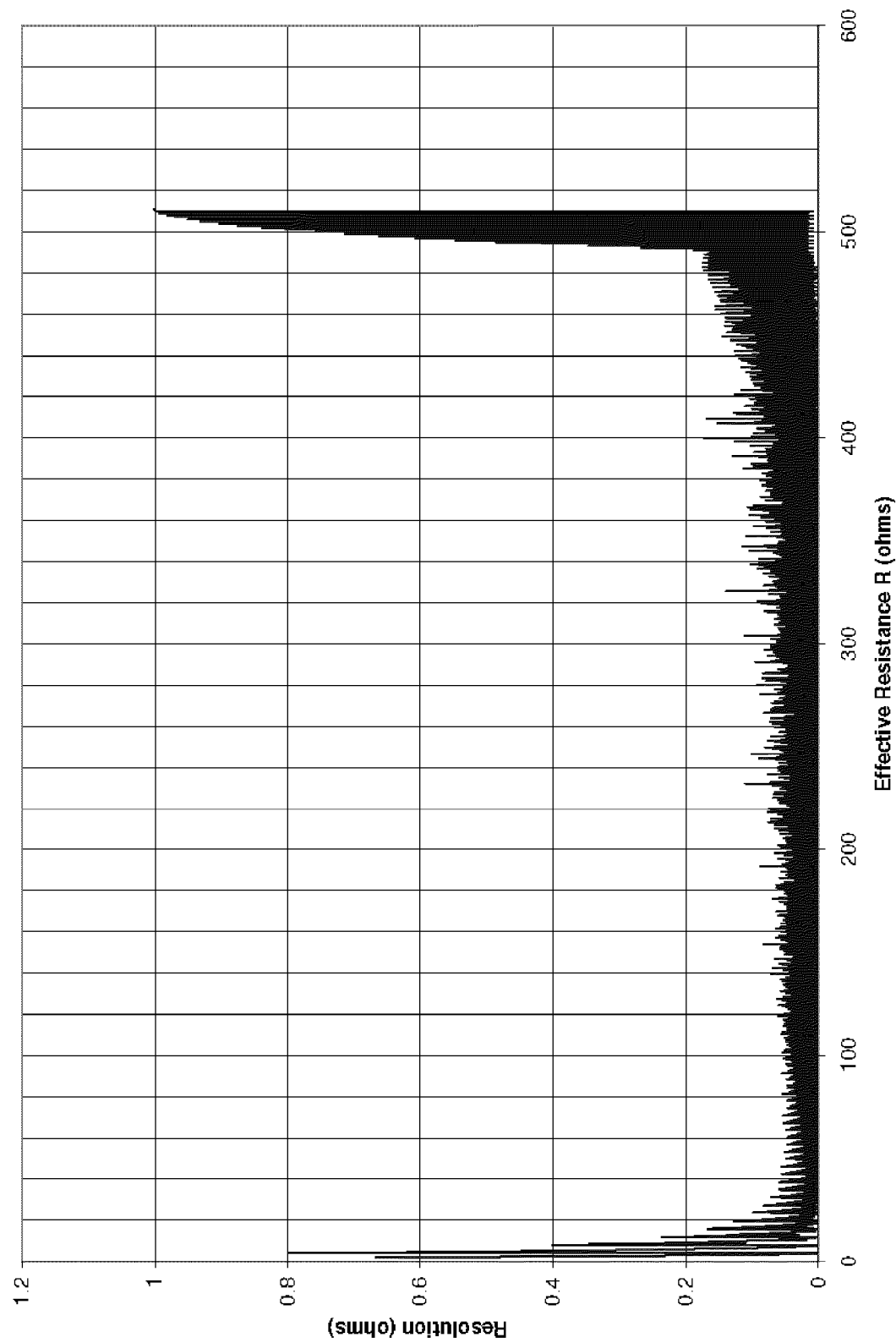
FIG. 3 is a graph of various effective resistance values on X-axis and resolution on Y-axis illustrating the variable resolution according to an aspect of the present invention.

FIG. 3 contains a graph with the effective resistance value R on the X-axis, and resolution values on Y-axis. As may be observed, the resolution is low (or resolution values high) towards the lower (0) and higher ends (512) of the effective resistance values, and is high in the middle.

From the description above, it may be appreciated that digital potentiometers can be controlled independently to achieve variable resolution. In addition, substantially equal effective resistance values can be attained using different combination of resistance values for R1 and R2 (with potentially different associated resolutions). Accordingly, it may be necessary to provide an approach (implemented either in processor 140 or controller block 130) to determine the resistance values R1 and R2 to attain a desired effective resistance R.

4. Determining R1 and R2 for a Desired Effective Resistance Value R

In one embodiment, the effective resistance R corresponding to all combinations of resistor values of R1 and R2 is computed, and the resulting table is stored in RAM 350. The table may be searched/examined (using a software implementation) to determine the values of R1 and R2 corresponding to a desired value of R. For a large number of combinations of R1 and R2, the table size may be unacceptably big, and a different approach may be used, as described below with reference to FIG. 4.

Figure 4:
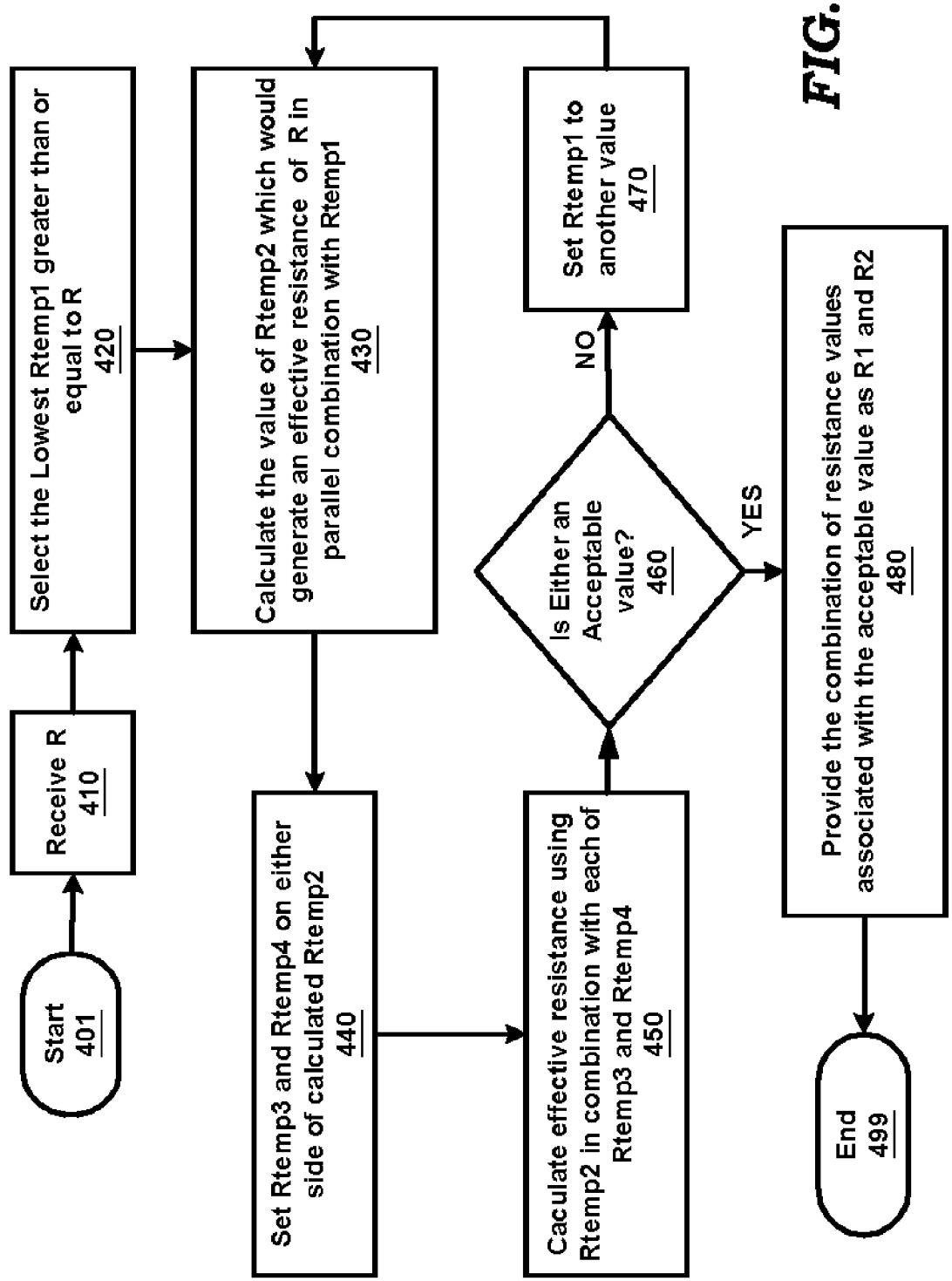
FIG. 4 is a flow chart illustrating the manner in which the resistance values of digital potentiometers can be determined to achieve a desired effective resistance in an embodiment of the present invention.

FIG. 4 is a flow chart illustrating the manner in which the values of R1 and R2 may be determined for a desired value of effective resistance R. The flow chart is described with reference to the embodiments of FIG. 1 merely for illustration. However, the flow chart can be implemented in other environments as well. The flow chart begins in step 401, in which control passes to step 410.

In step 410, the desired effective resistance value R is received. The value may be determined by resistor usage block 160 and sent to processor 140. In step 420, a value (Rtemp1) which is greater than or equal to effective resistance value R is selected. In step 430, a value Rtemp2 is computed according to Equation (1) noted above, but with Rtemp1 and Rtemp2 respectively being substituted for R1 and R2.

In step 440, two values (Rtemp3 and Rtemp4) are selected, with Rtemp3 representing a resistance value that is provided by digital potentiometer 110 and is lesser than or equal to Rtemp2, and Rtemp4 representing a resistance value that is provided by digital potentiometer 120 and is greater than Rtemp2.

In step 450, the effective resistance is computed for combinations of {Rtemp1, Rtemp3} and {Rtemp1, Rtemp4} again using Equation (1) noted above. In step 460, a determination is made as to whether any of the computed values is within an acceptable range from the desired effective resistance value (received in step 410). Control passes to step 480 if either computed value satisfies such a criteria, and otherwise to step 470.

In step 470, a new value is selected for Rtemp1. The new value may equal the next higher resistance value offered by digital potentiometer 110. Control then passes to step 430. In step 480, the combination of resistor values which caused a match in step 460 are passed as resistance values R1 and R2 (for programming the potentiometers 110 and 120). The flow-chart then ends in step 499.

From the above, it may be appreciated that suitable values of R1 and R2 may be determined to cause potentiometer 190 to provide a desired effective resistance R (with a high resolution). However, as noted above, the resolution is low in some ranges of R and high in other ranges. It may be desirable to have high resolution in a desired range of effective resistance R values. The manner in which such a feature can be achieved is described below with reference to FIG. 5.

5. High Resolution in Desired Range

Figure 5:
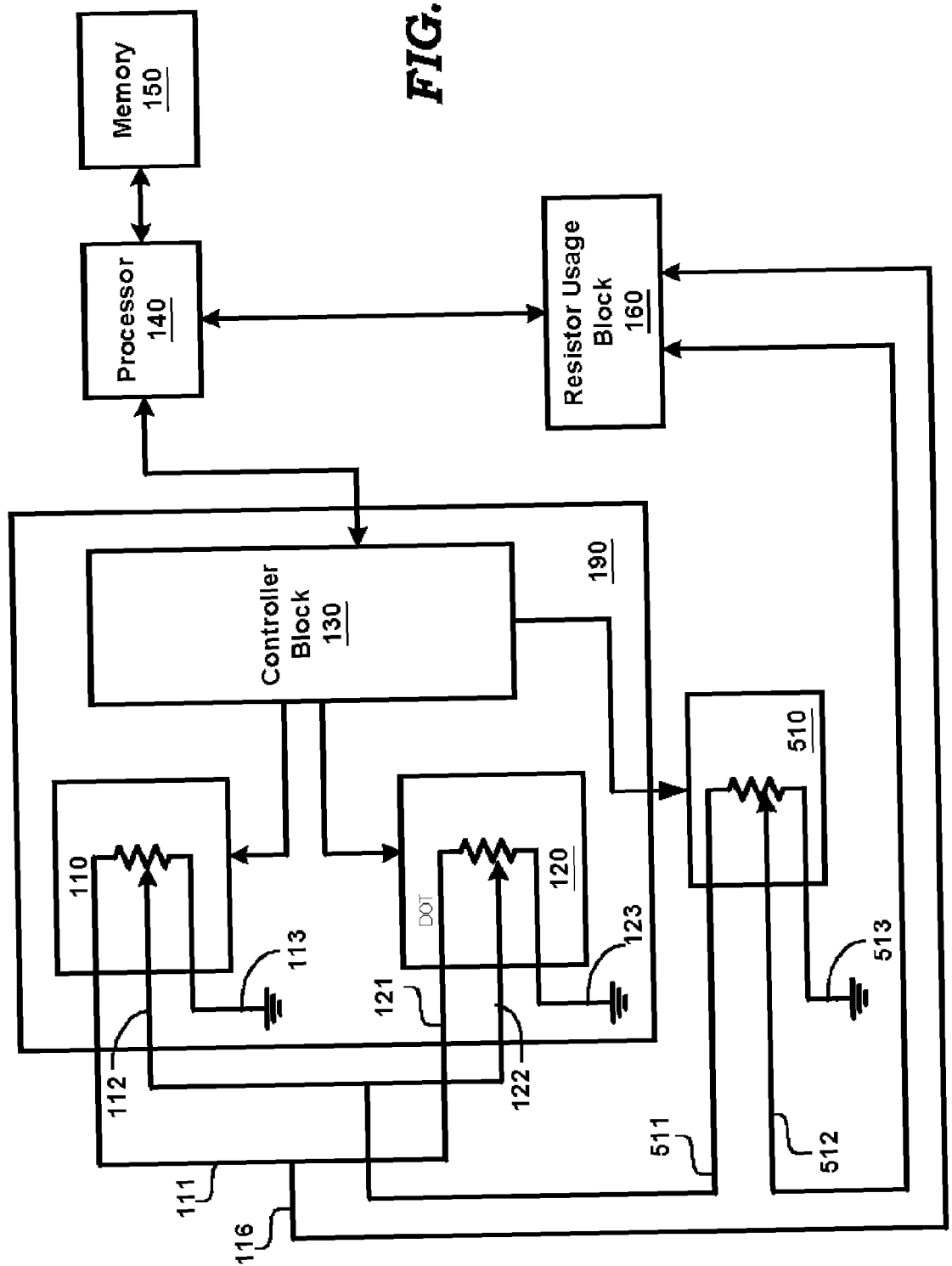
FIG. 5 is a block diagram illustrating the manner in which high resolution can be attained in any desired range of effective resistance values according to an aspect of the present invention.

FIG. 5 is a block diagram illustrating the manner in which the embodiment of FIG. 2 can be extended to provide high resolution (or low resolution values) in a desired range. Only the differences of FIG. 5 from FIG. 2 are described below in the interest of conciseness.

FIG. 5 is shown containing resistor 510 (which may again be formed by another digital potentiometer) in series with the parallel combination of digital potentiometers 110 and 120. The resistance value of resistor 510 can be chosen to ensure that the high resolution is attained in a desired range of resistance values. In addition, resistor 510 may be chosen to be a variable resistor such that the desired range can be adjusted depending on the specific requirements. Accordingly, controller block 130 may control the tap point of resistor 510 (though connection is not shown).

In addition, extending the approach of FIG. 4 to achieve high resolution in a desired range (as described above with reference to FIG. 5) will be apparent to one skilled in the relevant arts by reading the disclosure provided herein. Furthermore, though the description above is provided with reference to using two digital potentiometers, it should be understood that the approaches can be extended to use more potentiometers without departing from the scope and spirit of various aspects of the present invention.

6. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

APPENDIX

| R1 | R2 | R | Resolution |
|---|---|---|---|
| 4 | 4 | 2.00000 | |
| 4 | 8 | 2.66667 | 0.66667 |
| 4 | 12 | 3.00000 | 0.33333 |
| 4 | 16 | 3.20000 | 0.20000 |
| 4 | 20 | 3.33333 | 0.13333 |
| 4 | 24 | 3.42857 | 0.09524 |
| 4 | 28 | 3.50000 | 0.07143 |
| 4 | 32 | 3.55556 | 0.05556 |
| 4 | 36 | 3.60000 | 0.04444 |
| 4 | 40 | 3.63636 | 0.03636 |
| 4 | 44 | 3.66667 | 0.03030 |
| 4 | 48 | 3.69231 | 0.02564 |
| 4 | 52 | 3.71429 | 0.02198 |
| 4 | 56 | 3.73333 | 0.01905... |
| 1012 | 1016 | 507.96851 | 0.97049 |
| 1012 | 1020 | 507.99213 | 0.02362 |
| 1012 | 1024 | 508.00000 | 0.00787 |
| 1016 | 1016 | 508.98233 | 0.98233 |
| 1016 | 1020 | 508.99805 | 0.01572 |

APPENDIX-continued

| R1 | R2 | R | Resolution |
|---|---|---|---|
| 10165 | 1024 | 509.99216 | 0.99411 |
| 1020 | 1020 | 510.00000 | 0.00784 |
| 1020 | 1024 | 510.99805 | 0.99805 |
| 1024 | 1024 | 512.00000 | 1.00195 |

The invention claimed is:

1. A high resolution potentiometer comprising:
a first digital potentiometer and a second digital potentiometer connected in parallel, wherein said first digital potentiometer is operable to be set to offer a first resistance and said second digital potentiometer is operable to be set to offer a second resistance, wherein said first resistance is not equal to said second resistance; and
a controller block to cause said first digital potentiometer and said second digital potentiometer to respectively offer said first resistance and said second resistance.

2. The high resolution potentiometer of claim 1, wherein said controller block receives a desired resistance value and sets said first digital potentiometer to provide said first resistance and said second digital potentiometer to provide said second resistance such that the effective resistance provided by said high resolution potentiometer at least substantially equals said desired resistance.

3. The high resolution potentiometer of claim 1, wherein said controller block receives values corresponding to said first resistance and said second resistance, and sets said first digital potentiometer to provide said first resistance and said second digital potentiometer to provide said second resistance such that the effective resistance provided by said high resolution potentiometer at least substantially equals a desired resistance.

4. The high resolution potentiometer of claim 1, further comprising a resistor connected in series with said first digital potentiometer and said second digital potentiometer connected in parallel.

5. A high resolution potentiometer comprising:
a first digital potentiometer and a second digital potentiometer connected in parallel, wherein said first digital potentiometer is operable to be set to offer a first resistance and said second digital potentiometer is operable to be set to offer a second resistance, wherein said first resistance is not equal to said second resistance; and
a controller block to cause said first digital potentiometer and said second digital potentiometer to respectively offer said first resistance and said second resistance.
wherein said first potentiometer, said second potentiometer and said controller block are implemented in a single integrated circuit.

6. A system comprising:
a first digital potentiometer and a second digital potentiometer connected in parallel, wherein said first digital potentiometer is operable to be set to offer a first resistance and said second digital potentiometer is operable to be set to offer a second resistance, wherein said first resistance is not equal to said second resistance; and
a controller block to cause said first digital potentiometer and said second digital potentiometer to respectively offer said first resistance and said second resistance.

7. The system of claim 6, wherein said controller block receives a desired resistance value from a processor and sets said first digital potentiometer to provide said first resistance and said second digital potentiometer to provide said second resistance such that the effective resistance provided by said system at least substantially equals said desired resistance.

8. The system of claim 6, wherein said controller block receives values corresponding to said first resistance and said second resistance from a processor, and sets said first digital potentiometerto provide said first resistance and said second digital potentiometer to provide said second resistance such that the effective resistance provided by said first digital potentiometer and said second digital potentiometer are connected in parallel at least substantially equals a desired resistance.

9. The system of claim 6, further comprising a resistor connected in series with said first digital potentiometer and said second digital potentiometer connected in parallel.

10. A system comprising:
a first digital potentiometer and a second digital potentiometer connected in parallel, wherein said first digital potentiometer is operable to be set to offer a first resistance and said second digital potentiometer is operable to be set to offer a second resistance, wherein said first resistance is not equal to said second resistance;
a controller block to cause said first digital potentiometer and said second digital potentiometer to respectively offer said first resistance and said second resistance; and
wherein said first potentiometer, said second potentiometer and said controller block are implemented in the form of a single integrated circuit.

11. The system of claim 10, further comprising a processor, wherein said controller block receives a desired resistance value from said processor and sets said first digital potentiometer to provide said first resistance and said second digital potentiometer to provide said second resistance such that the effective resistance provided by said system at least substantially equals said desired resistance.

* * * * *